(12) United States Patent
Boguslavsky et al.

(10) Patent No.: US 11,618,683 B2
(45) Date of Patent: Apr. 4, 2023

(54) METHOD FOR CHEMICAL VAPOR DEPOSITION OF SYNTHETIC DIAMOND USING MULTIPLE HOT FILAMENT UNITS

(71) Applicant: ICDAT LTD., Nesher (IL)

(72) Inventors: Dimitry Boguslavsky, Haifa (IL); Adam Hoffman, Haifa (IL)

(73) Assignee: ICDAT LTD., Nesher (IL)

( * ) Notice: Subject to any disclaimer, the term of this patent is extended or adjusted under 35 U.S.C. 154(b) by 0 days.

(21) Appl. No.: 16/627,399

(22) PCT Filed: Jan. 8, 2019

(86) PCT No.: PCT/IB2018/054770
§ 371 (c)(1),
(2) Date: Dec. 30, 2019

(87) PCT Pub. No.: WO2019/003151
PCT Pub. Date: Jan. 3, 2019

(65) Prior Publication Data
US 2021/0087065 A1 Mar. 25, 2021

Related U.S. Application Data

(60) Provisional application No. 62/525,886, filed on Jun. 28, 2017.

(51) Int. Cl.
*C23C 16/27* (2006.01)
*C01B 32/26* (2017.01)
*C23C 16/46* (2006.01)

(52) U.S. Cl.
CPC ............ *C01B 32/26* (2017.08); *C23C 16/271* (2013.01); *C23C 16/46* (2013.01)

(58) Field of Classification Search
CPC ........ C23C 16/26; C23C 16/271; C23C 16/46; C23C 16/27
See application file for complete search history.

(56) References Cited

U.S. PATENT DOCUMENTS 5,160,544 A * 11/1992 Garg .................... C23C 16/271
118/724
5,814,149 A * 9/1998 Shintani .............. C23C 16/0281
423/446

(Continued)

OTHER PUBLICATIONS

Haubner, R., et al., "Diamond growth by hot-filament chemical vapor deposition: state of the art". Diamond and Related Materials, vol. 2, Issue 9, Jul. 1, 1993, pp. 1277-1294.*

(Continued)

*Primary Examiner* — Bret P Chen
(74) *Attorney, Agent, or Firm* — Reches Patents

(57) ABSTRACT

A method for synthesizing a diamond by chemical vapor deposition, the method may include heating at least one internal space of at least one hot filament unit; wherein the at least one hot filament unit is positioned in a vacuum chamber; wherein a volume of each internal space out of the at least one internal space is smaller than one half of a volume of the vacuum chamber; feeding at least one gas to the at least one internal space; wherein the at least one gas comprises at least a carbon carrier gas; breaking the at least one gas by the at least one hot filament unit, to provide at least one radical; and depositing the at least one radical on an area of a substrate to provide the diamond.

20 Claims, 18 Drawing Sheets

(56) References Cited

U.S. PATENT DOCUMENTS

| | | | | |
|---|---|---|---|---|
| 5,993,919 | A * | 11/1999 | Tsuno | C23C 16/271 427/249.11 |
| 6,200,652 | B1 * | 3/2001 | Sun | C23C 16/271 427/249.11 |
| 6,558,742 | B1 * | 5/2003 | Tzeng | C23C 16/277 427/249.11 |
| 8,318,029 | B1 * | 11/2012 | Kley | G01Q 30/02 216/41 |
| 2001/0053422 | A1 * | 12/2001 | Lee | H01J 37/32027 427/249.1 |
| 2004/0069231 | A1 * | 4/2004 | Chae | C23C 16/271 427/249.7 |
| 2006/0263233 | A1 * | 11/2006 | Gardinier | A61L 27/303 419/11 |
| 2007/0031694 | A1 * | 2/2007 | Hosonuma | C02F 1/46109 427/249.1 |
| 2009/0017258 | A1 * | 1/2009 | Carlisle | C23C 16/279 427/249.8 |
| 2009/0154882 | A1 * | 6/2009 | Salokatve | G02B 6/2835 385/50 |
| 2009/0197014 | A1 * | 8/2009 | Wu | C23C 16/271 427/569 |
| 2009/0324810 | A1 * | 12/2009 | Serikawa | C02F 1/46109 427/78 |
| 2015/0218694 | A1 * | 8/2015 | Xu | C23C 16/279 428/206 |
| 2015/0315707 | A1 * | 11/2015 | Xue | C23C 16/452 427/534 |
| 2016/0013053 | A1 * | 1/2016 | Ashihara | H01L 21/02326 118/723 VE |
| 2019/0071776 | A1 * | 3/2019 | Boguslavsky | C23C 16/402 |

OTHER PUBLICATIONS

Lai, Guan-Ren, et al., "Deposition of Diamond Films in a Closed Hot Filament CVD System". Journal of Research of the National Institute of Standards and Technology, vol. 100, No. 1, Jan.-Feb. 1995, pp. 43-49.*

Ahmed, Raju, et al., "Selective Area Deposition of Hot Filament CVD Diamond on 100 mm MOCVD Grown AlGaN/GaN Wafers". Crystal Growth & Design, 2019, 19, 672-677.*

Chen, Yan, et al., "High efficiency deposition of diamond film by hot filament chemical vapor deposition". Journal of Materials Research, vol. 11, No. 12, Dec. 1996, pp. 2957-2960.*

Lin, T., et al., "Compositional mapping of the argon-methane-hydrogen system for polycrystalline to nanocrystalline diamond film growth in a hot-filament chemical vapor deposition system". Applied Physics Letters, vol. 77, No. 17 (2000) pp. 2692-2694.*

Yu, S.C., et al., "CVD diamond growth with hot filament processes". Materials Science Monographs, Elsevier, vol. 73, 1991, pp. 555-560.*

Lai, Guan-Ren, et al., "Deposition of Diamond Films in a Closed Hot Filament CVD System". J Res Natl Inst Stand Technol. Jan.-Feb 1995;100(1):43-49.*

Li, Jun, "Design of multi-filament arrays and substrate holders in hot-filament CVD reactors for large area diamond film deposition". Dissertation, Dec. 17, pp. 1-24. Excerpt Only.*

Blue Wave Semiconductors, HFCVD Graphene Plus Brochure, Aug. 2011, 1 page.*

* cited by examiner

B-B

METHOD FOR CHEMICAL VAPOR DEPOSITION OF SYNTHETIC DIAMOND USING MULTIPLE HOT FILAMENT UNITS

CROSS REFERENCE

This application claims priority from U.S. provisional application 62/525,886 filing date Jun. 28, 2017.

BACKGROUND

Chemical vapor deposition (CVD) can be used to produce a synthetic diamond (www.wikipedia.org) by creating the circumstances necessary for carbon atoms in a gas to settle on a substrate in crystalline form.

CVD production of diamonds has received a great deal of attention in the materials sciences because it allows many new applications of diamonds that had previously been considered too difficult to make economical. CVD diamond growth typically occurs under low pressure (1-27 kPa; 0.145-3.926 psi; 7.5-203 Torr) and involves feeding varying amounts of gases into a chamber, energizing them and providing conditions for diamond growth on the substrate. The gases always include a carbon source, and typically include hydrogen as well, though the amounts used vary greatly depending on the type of diamond being grown.

One of the energy sources is a hot filament. The hot filament is intended to generate a plasma in which the gases are broken down (to radicals) and more complex chemistries occur.

One prior art CVD system directs $H_2$ and $CH_4$ gases towards a grid of linear filaments. The grid of liner filaments is heated to about 2000 degree Celsius. An example of the grid of linear filaments and a cross section of a chamber are illustrated in FIG. 1.

FIG. 1 illustrates a vacuum chamber (chamber 21) that includes gas source 22 that outputs $H_2$ and $CH_4$ towards a grid of linear filaments 23 located within the vacuum chamber.

The $H_2$ and $CH_4$ gases are broken to radicals such as $H^*$ and $CH_3^*$. These radicals are directed towards a synthetic diamond 910 that is supported by a substrate 920. The substrate is supported and globally heated by a support unit and heating unit 24.

Due to the high temperature and the flow of $CH_4$ the filaments undergo an unwanted carburization, become very fragile—and their lifespan is very limited—even to a single CVD iteration.

The substrate is positioned on a support module and is placed below the grid of linear filaments. A synthetic diamond is grown on a region of the substrate.

Due to the high temperature of the grid—the substrate should be spaced apart from the grid by a substantial distance—which reduces the efficiency of the CVD process—as the substantial distance increases the amount of recombination of the radicals.

The efficiency of the CVD process is further reduced by the relative large volume of the chamber—as only a small amount of the gas that enters the chamber is really broken to radicals.

There is a growing need to provide an effective system and method for CVD of synthetic diamonds.

SUMMARY

There may be provided a method for synthesizing a diamond by chemical vapor deposition, the method may include heating at least one internal space of at least one hot filament unit; wherein the at least one hot filament unit may be positioned in a vacuum chamber; wherein a volume of each internal space out of the at least one internal space may be smaller than one half of a volume of the vacuum chamber; feeding at least one gas to the at least one internal space; wherein the at least one gas may include at least a carbon carrier gas; breaking the at least one gas by the at least one hot filament unit, to provide at least one radical; and depositing the at least one radical on an area of a substrate to provide the diamond.

The carbon carrier gas may be methane and the at least one gas also may include H.

The breaking of the at least one gas may be executed while the at least one gas may be within the at least one internal space.

The at least one internal space may be partially thermally isolated from the substrate.

The at least one hot filament unit may include multiple hot filament units; and wherein the at least one gas may include a plurality of gases.

The method may include feeding different gases of the plurality of gases to different hot filament units of the multiple hot filament units.

The hot filament unit of the multiple hot filament units may be thermally isolated from at one other hot filament unit of the multiple hot filament units.

The hot filament unit of the multiple hot filament units may be thermally coupled to at one other hot filament unit of the multiple hot filament units.

The hot filament unit of the multiple hot filament units and another hot filament unit of the multiple hot filament units may be coaxial.

The method may include independently heating internal spaces of at least two hot filament units of the multiple hot filament units.

The method may include independently feeding gases to at least two hot filament units of the multiple hot filament units.

The multiple hot filament units may include multiple capillary tubes.

The multiple hot filament units may include multiple internal spaces; and wherein the method may include controlling a flow of gas within one or more internal spaces of the multiple internal spaces using one or more flow controllers.

The one or more flow controller may be configured to be at least partially positioned at a certain position in which the one or more flow controllers may be within the one or more internal spaces.

The multiple hot filament units may include multiple internal spaces.

The method may include independently heating at least two of the multiple internal spaces.

The method may include heating the multiple internal spaces by a group of heating elements.

There may be more internal spaces than heating elements of the group.

The method may include heating at least one area of the substrate.

The method may include selectively heating some points of the substrate while preventing from directly heating other points of the substrate.

The method may include heating by radiation some points of the substrate.

The heating of at least one internal space of at least one hot filament unit may include utilizing an external heating element located outside at least one internal space.

The method a ratio between (a) the volume of the vacuum chamber and (b) a volume of one of the at least one internal space ranges between five and one hundred.

There may be provided a system for synthesizing a diamond by chemical vapor deposition, the system may include a vacuum chamber; a gas source; at least one hot filament unit that may include at least one internal space; at least one heating element that may be configured to heat the at least one internal space; wherein the at least one hot filament unit may be positioned in a vacuum chamber; wherein a volume of each internal space out of the at least one internal space may be smaller than one half of a volume of the vacuum chamber; wherein the gas source may be configured to feed at least one gas to the at least one internal space; wherein the at least one gas may include at least a carbon carrier gas; wherein the at least one hot filament unit may be configured to break the at least one gas, to provide at least one radical; and wherein the system may be configured to deposit the at least one radical on an area of a substrate to provide the diamond.

The carbon carrier gas may be methane and the at least one gas also may include H.

The breaking of the at least one gas may be executed while the at least one gas may be within the at least one internal space.

The at least one internal space may be partially thermally isolated from the substrate.

The at least one hot filament unit may include multiple hot filament units; and wherein the at least one gas may include a plurality of gases.

The system may include a gas distribution system for feeding different gases of the plurality of gases to different hot filament units of the multiple hot filament units.

The a hot filament unit of the multiple hot filament units may be thermally isolated from at one other hot filament unit of the multiple hot filament units.

The a hot filament unit of the multiple hot filament units may be thermally coupled to at one other hot filament unit of the multiple hot filament units.

The a hot filament unit of the multiple hot filament units and another hot filament unit of the multiple hot filament units may be coaxial.

The at least one heating element may be configured to independently heat internal spaces of at least two hot filament units of the multiple hot filament units. Different heating elements may be fed by different control signals and/or different heating signals.

The system may include and/or may be coupled to a fluid distribution system that may be configured to independently feed gases to at least two hot filament units of the multiple hot filament units. The fluid distribution system may include valves, inlets, outlets, and/or any fluid control element. The fluid distribution system may be located inside the vacuum chamber, outside the vacuum chamber or partially inside and partially outside the vacuum chamber.

The multiple hot filament units may include multiple capillary tubes.

The multiple hot filament units may include multiple internal spaces; and wherein the system may include one or more flow controllers that may be configured to control a flow of gas within one or more internal spaces of the multiple internal spaces.

The one or more flow controller may be configured to be at least partially positioned at a certain position in which the one or more flow controllers may be within the one or more internal spaces.

The multiple hot filament units may include multiple internal spaces.

The at least one heating element may be configured to independently heat at least two of the multiple internal spaces.

The at least one heating element may form a group of heating elements that may be configured to heat the multiple internal spaces.

There may be more internal spaces than heating elements of the group.

The one or more of the at least one heating elements may be configured to heat at least one area of the substrate.

The one or more of the at least one heating elements may be configured to selectively heat some points of the substrate while preventing from directly heating other points of the substrate.

The one or more of the at least one heating elements may be configured to heat by radiation some points of the substrate.

The at least one heating element may include an external heating element located outside at least one internal space.

The ratio between (a) the volume of the vacuum chamber and (b) a volume of one of the at least one internal space ranges between one hundred and five.

The system may include a controller (not shown) for controlling the operation of the system. The controller may include a hardware computer, a hardware processing circuits, and the like.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
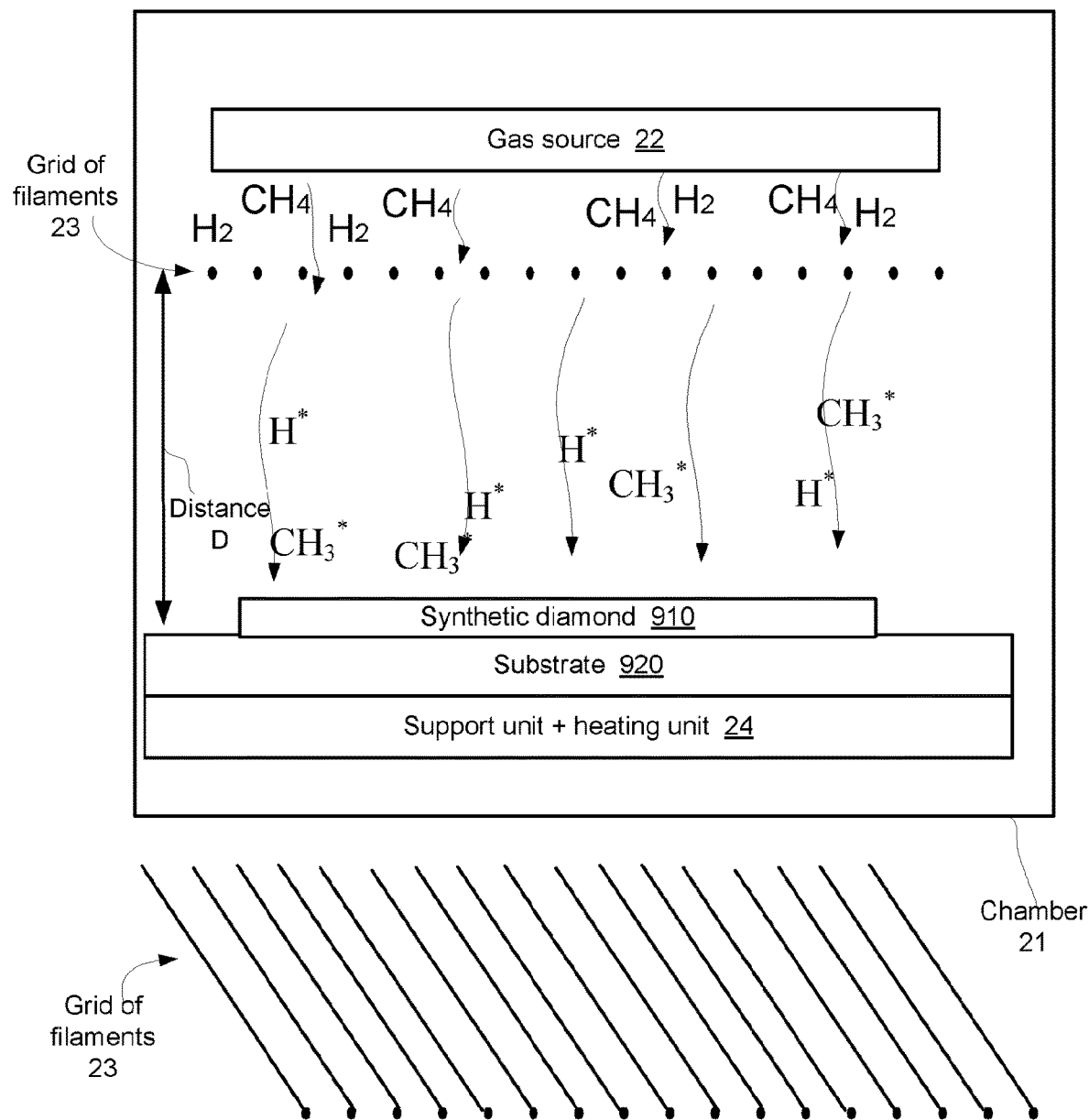
FIG. 1 is an example of a prior art system.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Any reference in the specification to a system should be applied mutatis mutandis to a method that can be executed by the system.

The phrase "and/or" means additionally or alternatively.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

There is provided a system that may include one or more hot filament units.

The one or more hot filaments units may be stationary, and/or may be moved in relation to the vacuum chamber, may be held within the vacuum chamber in nay known manner—by rams, frames, or any other structural elements.

A hot filament unit is compact and may include multiple mini-chambers for treating different gases.

The number of mini-chambers may be equal to the number of different input gases—but this is not necessarily so. More than two gases may be provided to a single mini-chamber and/or a certain gas may be fed to multiple mini-chambers.

Radicals that are outputted from the mini-chambers may be mixed before contacting the substrate. The system may include a mixer for mixing the radicals. Alternatively, the different radicals may be directed to the same space without using a mixer. Any system or unit for directing the radicals towards the substrate and/or the diamond may be provided.

The temperature within one mini-chamber may be set independently from the temperature within another mini-chamber.

A first mini-chamber may receive $H_2$, may be heated to about 2000 degree Celsius, and output $H^*$. A second mini-chamber may receive $CH_4$ may be heated to about 600 degrees Celsius, and output $CH_3^*$.

One or more mini-chambers may be thermally isolated from each other.

One or more mini-chambers may be thermally coupled to each other. The thermal coupling may allow one mini-chamber to benefit from the heating of another mini-chamber—and may be reduce the energy consumption of the system.

A heating of a mini-chamber may be achieved by any know heating technique including but not limited to Ohmic heating.

Mini-chambers may have the same volume and/or shape and/or size and/or orientation.

Mini-chambers may differ from each other by volume and/or shape and/or size and/or orientation.

A mini-chamber may be shaped and sized in any manner.

A mini-chamber may be shaped and sized to define an inner space that has any desired contact area to volume ratio. It has been found that larger contact area to volume ratios yield more efficient gas breaking techniques.

The inner walls of the mini-chambers may be smooth, curved and/or non-smooth. Non-smooth inner walls may increase the contact area to volume ratio.

FIGS. 2-7, 11 and 13-17 illustrate mini-chambers that define elongated and narrow volumes that exhibit a relatively high contact area to volume ratios.

In FIGS. 2-7, 11 and 13-17 the mini-chambers are parallel to each other and have the same length. This is not necessarily so—one mini-chamber may be oriented to another mini-chamber and/or may be longer (or shorter) than the other mini-chamber.

The mini-chambers may be at least partially thermally isolated from the substrate and thus may be positioned much closer to the substrate.

The at least partial isolation may be achieved by using thermal isolators (such as ceramic elements) at the exterior of the min-chambers and by having relatively small apertures (for example millimetric scale apertures) for exiting the radicals.

In FIGS. 2-7, 11 and 13-17 the mini-chambers are shown as having relatively small apertures (for example—millimetric) that face the substrate—which may contribute to the partial thermal isolation from the substrate.

Furthermore—heating smaller volumes (heating small internal volumes of mini-chambers instead of heating much larger volumes in FIG. 1 FIG. 1) requires less energy and thus reduces potential damage to the substrate.

FIGS. 2-7 and 11 illustrate a hot filament unit (denoted 300 in FIG. 2) that includes a first mini-chamber 50 for breaking $H_2$, that has a cylindrical shape, and a second mini-chamber 30 for breaking $CH_4$ that has a tubular cross section and surrounds the first mini-chamber 50.

Mini-chambers for breaking other gases may be used. Both mini-chambers are coaxial.

The radius of the capillary tube may be of any dimension—for example may range between 0.5 and 5 centimeters. The height of the capillary tube may be of any dimension—for example may range between 10 and 1000 centimeters.

Figure 2:
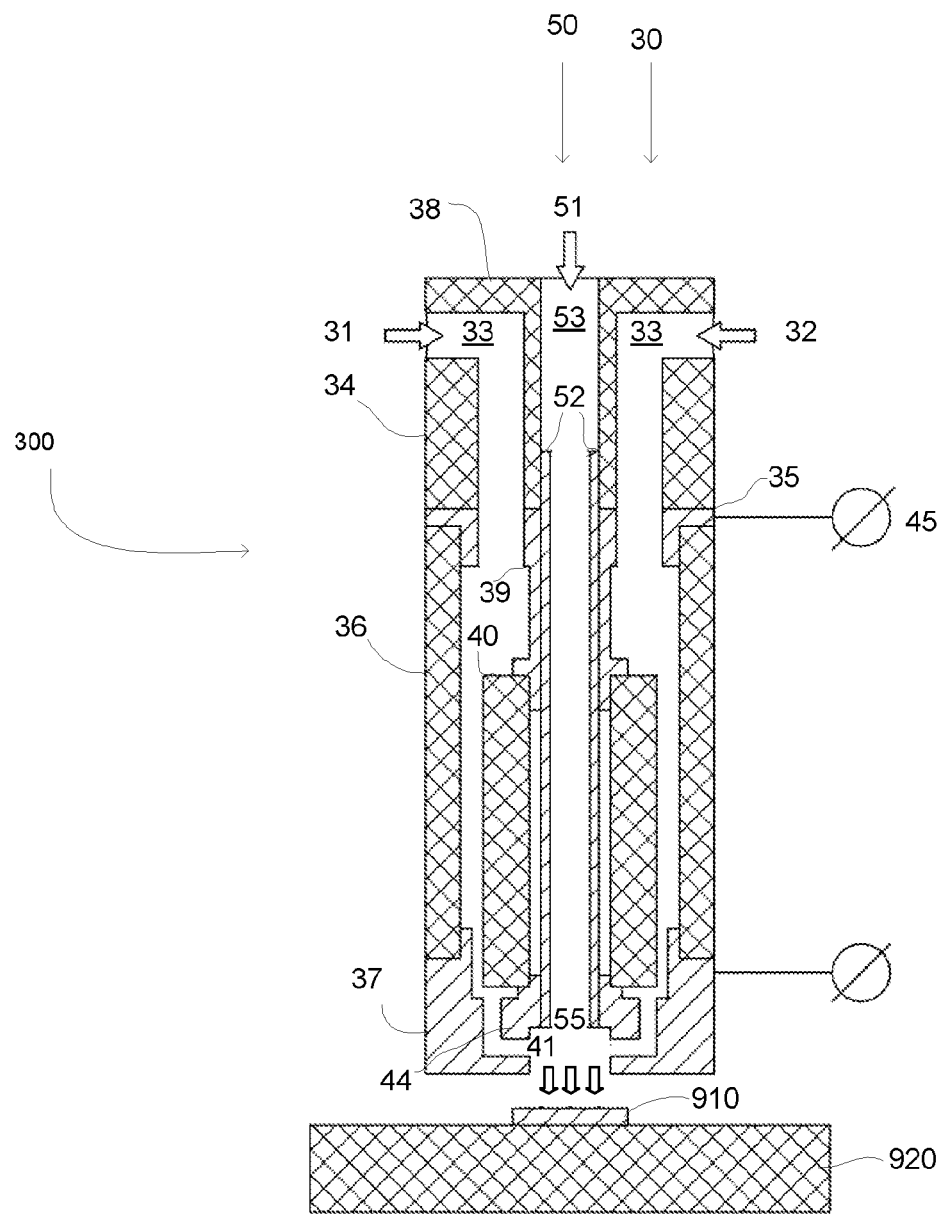
FIG. 2 is an example of a hot filament unit.

Referring to FIG. 2:
a. The first mini-chamber includes a top opening ($H_2$ gas input), a capillary tube through which the $H_2$ flows, a body that is electrically coupled to the capillary tube and has contacts (denoted HF contacts—hot filament contacts), an inner ceramic tube and an outlet—for outputting $H^*$. The contacts are fed by a current source that heats the body and the capillary tube.
b. The second mini-chamber includes one or more top openings ($CH_4$ gas input), an outer ceramic tube, an external heater that has contacts and an outlet—for outputting $CH_3^*$. The inner ceramic tube and the outer ceramic tube defined a long and narrow inner volume through which the CH$_4$ flows.

Referring to FIG. 2—the first mini-chamber 50 includes an input 51, a first internal space 53 that is partially surrounded by capillary tube 52, and an output 55. The capillary tube 52 is heated by a passage of an electric current via a path that includes source 45, first external conductive element 35, first intermediate conductive element (denoted 46 in FIG. 3), first internal conductive element 39, the capillary tube 52, second internal conductive element 44, second intermediate conductive element (denoted 48 in FIG. 3) and second external conductive element 37.

The second mini-chamber 30 includes inputs 31 and 32, a second internal space 33 that is defined between various external structural elements (38, 35, 36, 37) and various internal structural elements (38, 39, 40 and 44).

The internal elements and/or the external structural elements may define the internal space 33—and may (or may not) have an additional function. For example, external ceramic tube 36 and internal ceramic tube 40 at least partially thermally insolate internal space 33 from its environment. Yet for another example—some of the internal and/or external structural elements conduct electrical signals, and the like. Internal space 33 end at output 41.

The second internal space 33 may be heated by the capillary tube 52, and/or may have its own heating element (not shown).

Figure 3:
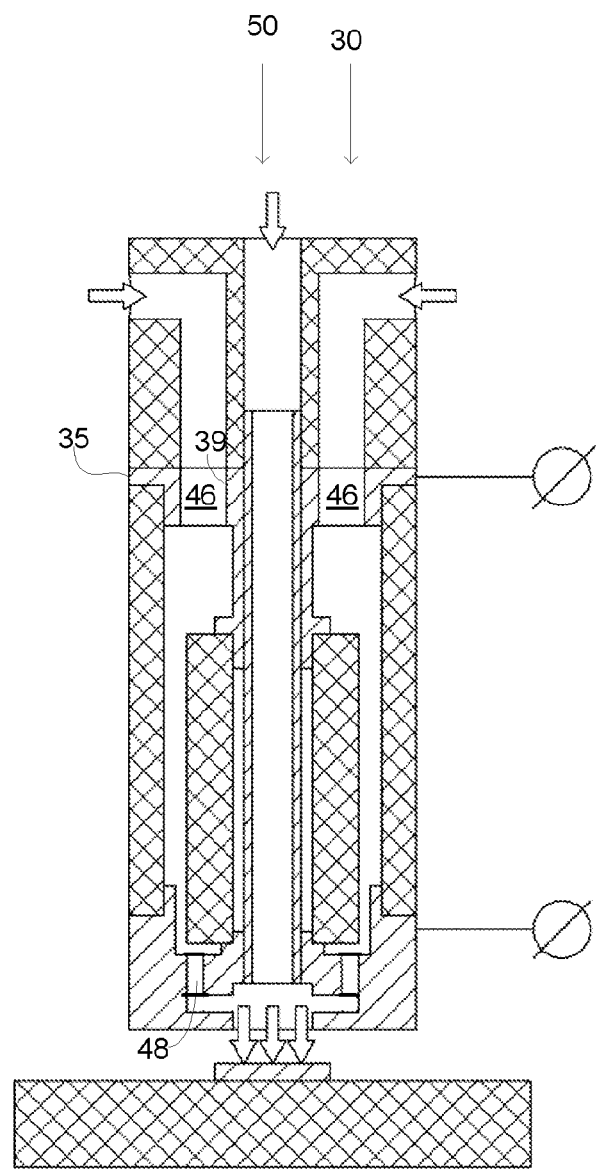
FIG. 3 is an example of a hot filament unit.

FIG. 3 illustrates (a) the first intermediate conductive element 46 that electrically couples the first external conductive element 35 to the first internal conductive element 39, and (b) the second intermediate conductive element 48 that electrically couples the second external conductive element 37 to the second internal conductive element 44.

The first intermediate conductive element 46 and the second intermediate conductive element 48 may be formed on the sidewall of second internal space 33—or formed in any manner that does not prevent the passage of gas through the second internal space 33.

Figure 4:
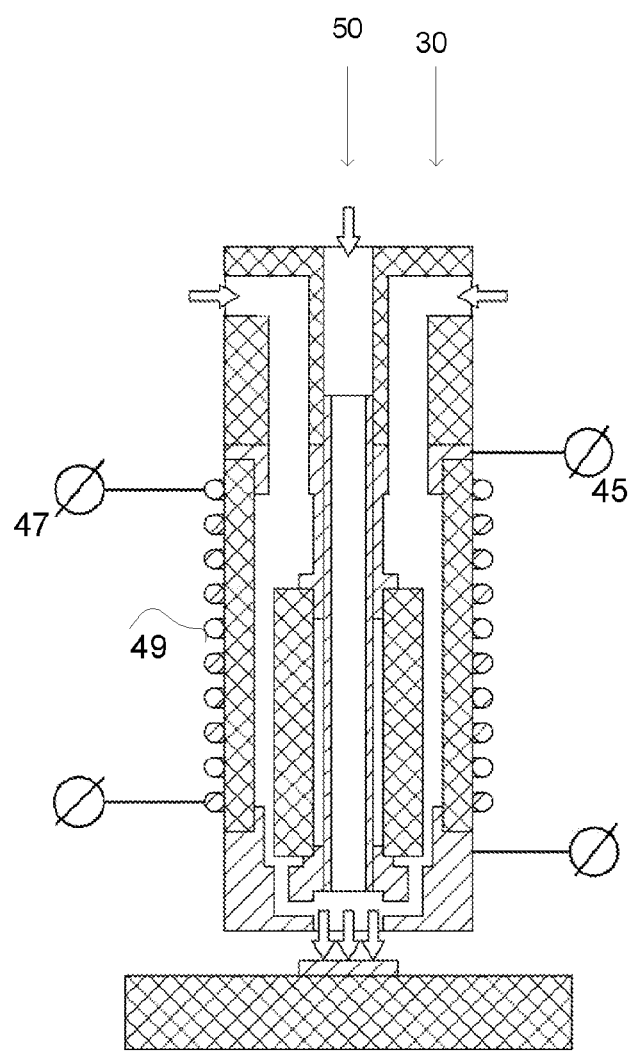
FIG. 4 is an example of a hot filament unit.

FIG. 4 illustrates a hot filament unit that includes an external heating element 49 for heating the first min-chamber. The external heating element 49 is fed by current from current source 47—and may have a spiral shape or a non-spiral shape. The hot filament unit also heats the first internal space 53 using current that flows through capillary tube 52.

Figure 5:
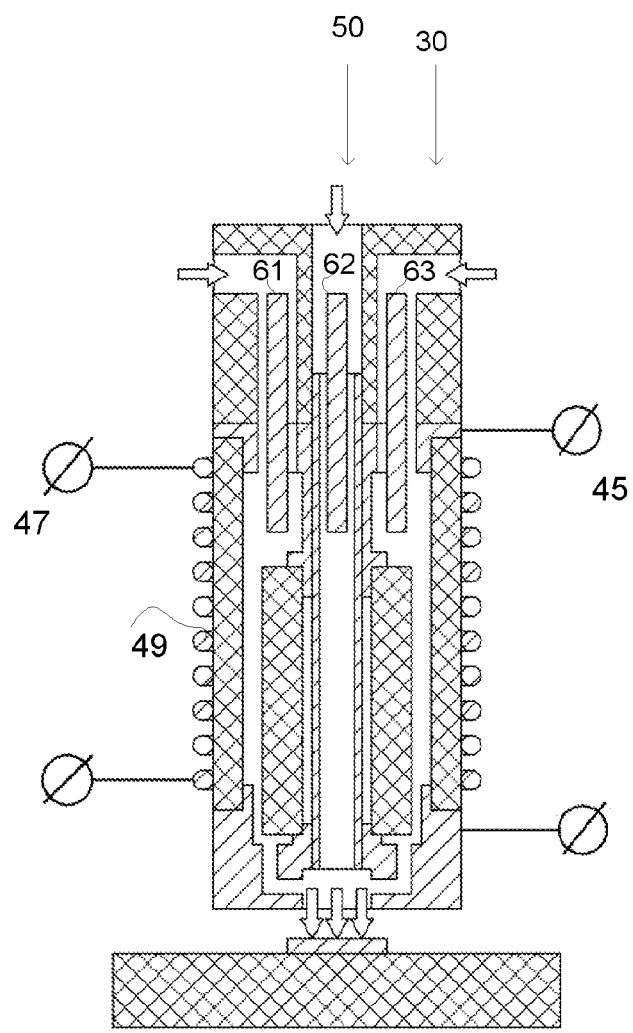
FIG. 5 is an example of a hot filament unit.

FIG. 5 illustrates a hot filament unit that includes flow distributors 61, 62 and 63 for controlling the flow of gas within first and second internal spaces 53 and 33. The hot filament unit also includes an external heating element 49 for heating the first min-chamber. The external heating element 49 is fed by current from current source 47—and may have a spiral shape or a non-spiral shape. The hot filament unit also heats the first internal space 53 using current that flows through capillary tube 52.

Figure 6:
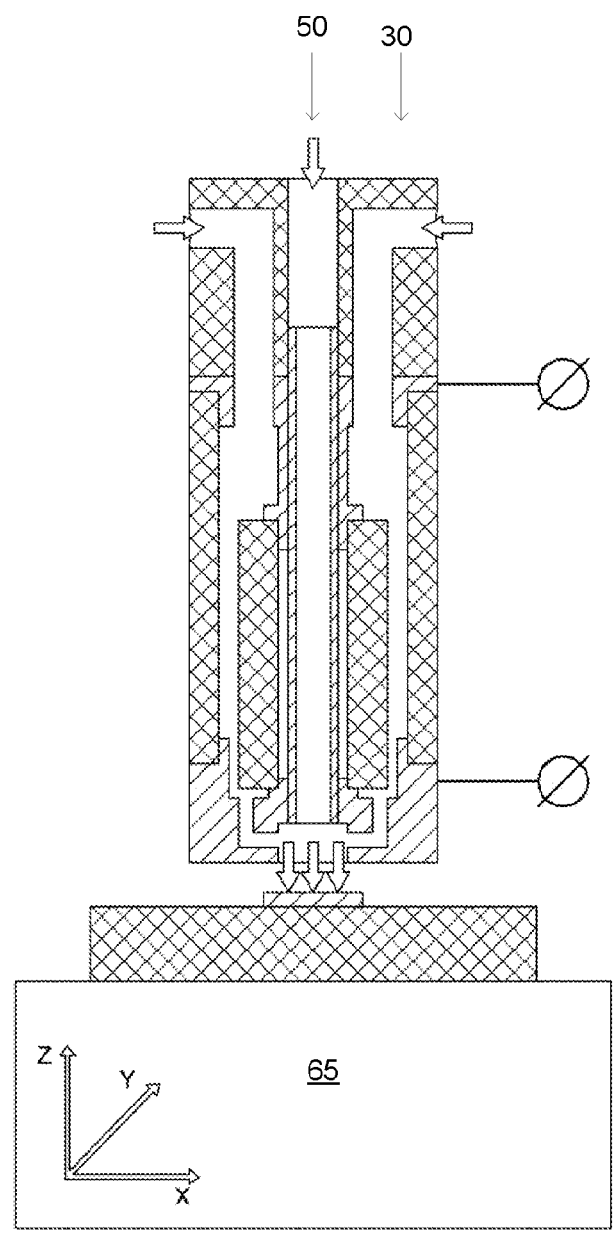
FIG. 6 is an example of a hot filament unit with a substrate scanning device.

FIG. 6 illustrates a hot filament unit and a movement system 65 for moving the substrate in relation to the hot filament unit.

Figure 7:
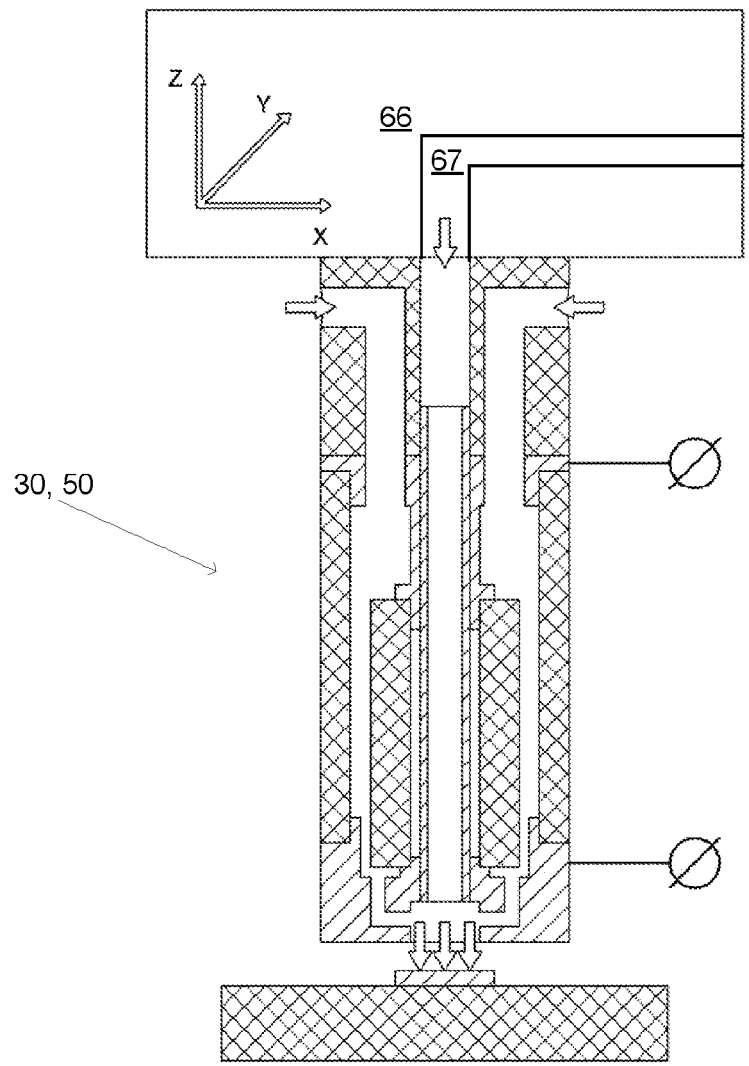
FIG. 7 is an example of a hot filament unit with a filament scanning device.

FIG. 7 illustrates a hot filament unit that is coupled to a movement system 66 for moving the hot filament unit in relation to the substrate.

Figure 8:
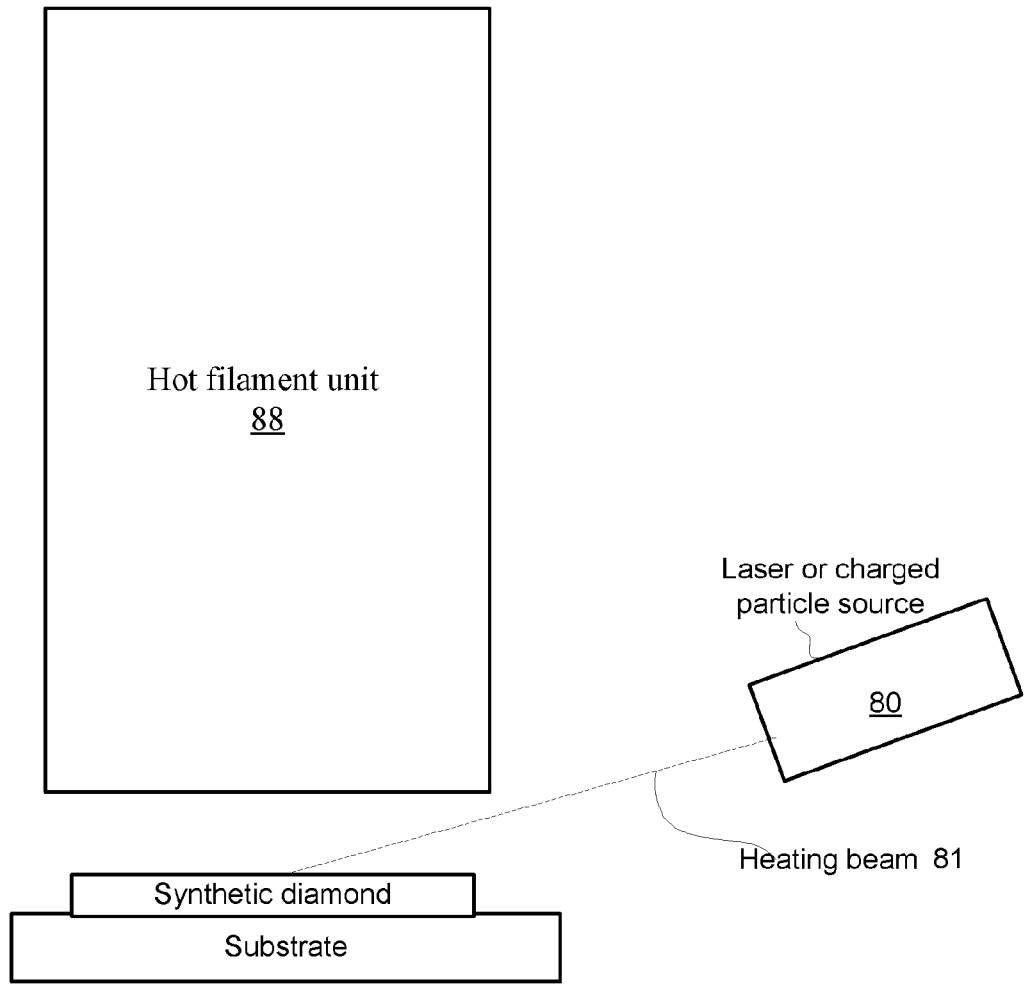
FIG. 8 is an example of a hot filament unit with a laser heating device.

FIG. 8 illustrates a hot filament unit 88 and a laser or charged particle source 80 that directs a heating beam 81 of radiation towards selected sports of the synthetic diamond. There may be any spatial relationship between the substrate, the hot filament unit, the laser or charged particle source 80 and the heating beam 81. In FIG. 8 the laser or charged particle source 80 positioned at the side of the hot filament unit 88—and the heating beam is neither normal or parallel to the synthetic diamond.

Figure 9:
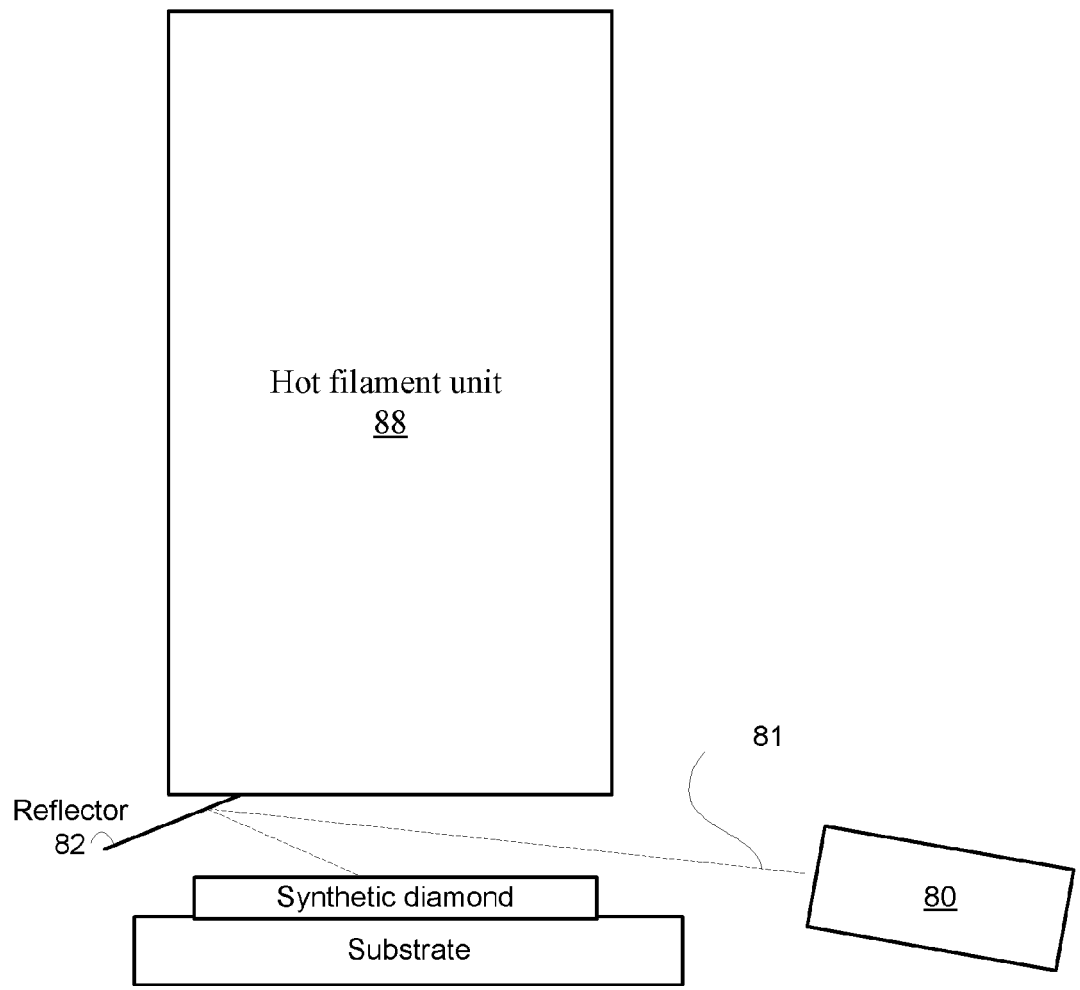
FIG. 9 is an example of a hot filament unit with a charged particle heating device.

FIG. 9 differs from FIG. 8 by illustrating a reflector 82 and having the laser or charged particle source 80 direct the heating beam 81 of radiation towards the reflector 82 that reflects the heating beam towards selected sports of the synthetic diamond. There may be any spatial relationship between the substrate, the hot filament unit, the reflector 82, the laser or charged particle source 80 and the heating beam 81.

Figure 10:
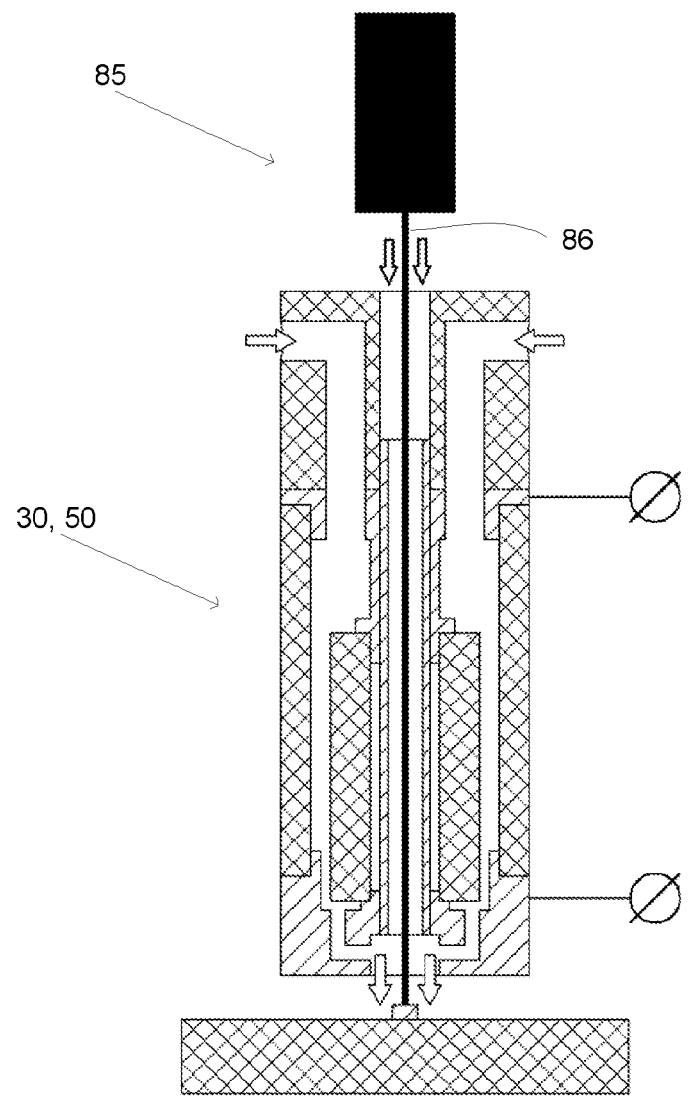
FIG. 10 is an example of a hot filament unit with a laser or charged particle heating device.

FIG. 10 illustrates a hot filament unit 88 and a laser or charged particle source 85 that directs a heating beam 86 of radiation towards selected sports of the synthetic diamond. There may be any spatial relationship between the substrate, the hot filament unit, the laser or charged particle source 85 and the heating beam 88. In FIG. 10 the laser or charged particle source 80 is positioned above the hot filament unit 88—and is configured to direct heating beam 86 through the first internal space (denoted 53 in FIG. 2).

Figure 11:
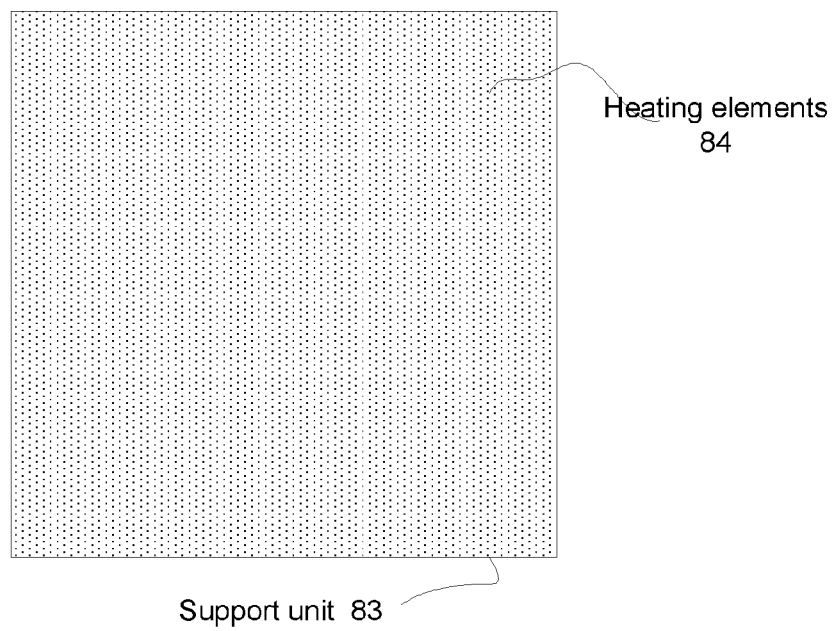
FIG. 11 is an example of multiple heating elements of a support unit.

FIG. 11 illustrates a support unit 83 for supporting the substrate. The support unit 83 may include multiple heating elements—such as the grid of heating elements 84. The heating elements may be independently controlled—thereby selectively heating some points of the substrate.

The radiation based heating may involve directing multiple heating beams towards the substrate at the same time, at different points of time, in a continuous manner, in a non-continuous manner, to the same location, to different locations, and the like.

Figure 12:
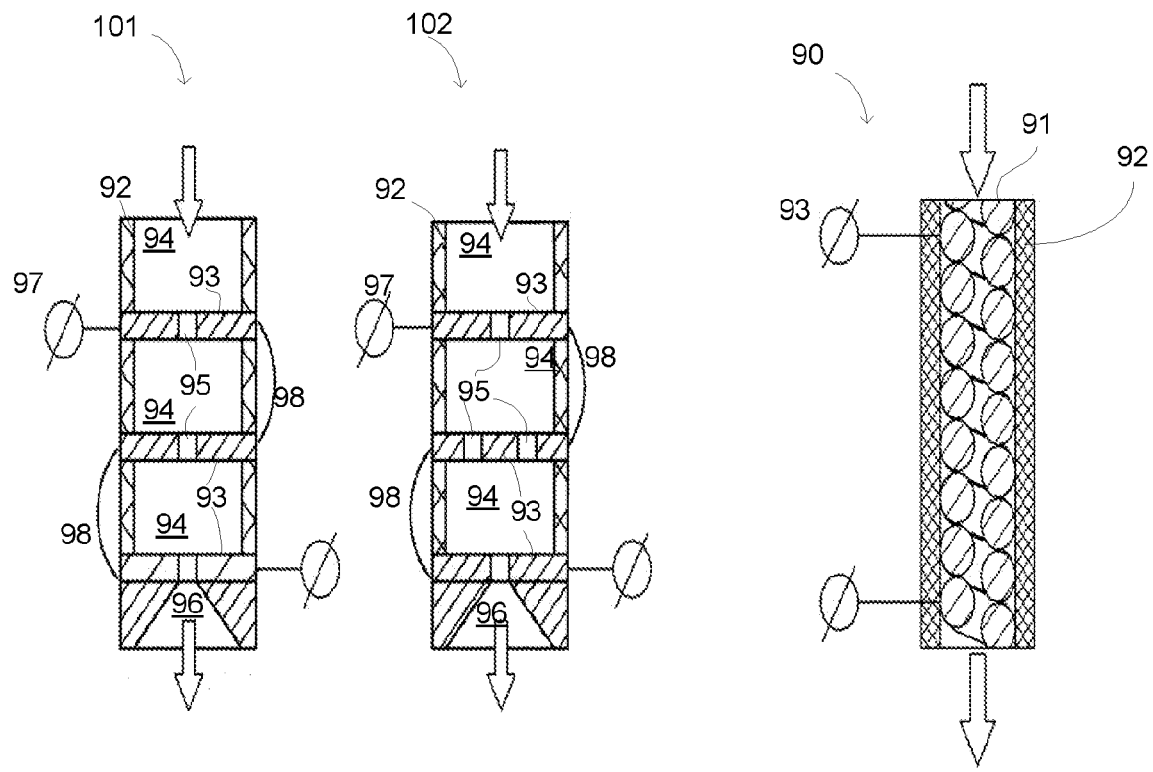
FIG. 12 includes examples of various min-chambers.
Figure 13:
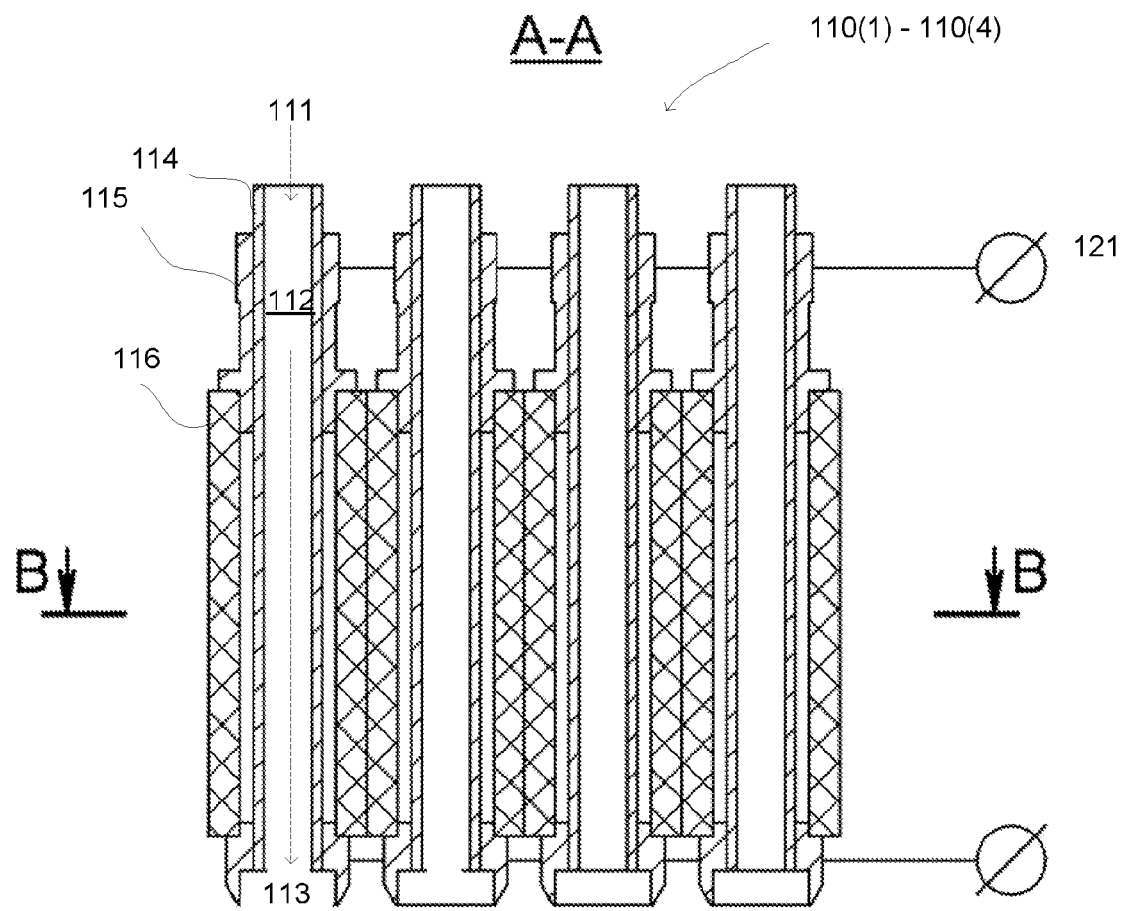
FIG. 13 is an example of a matrix of hot filament units.
Figure 14:
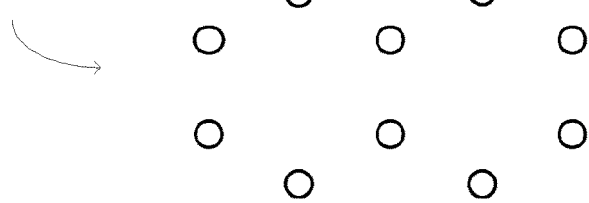
FIG. 14 is an example of a chamber and a matrix of hot filament units.
Figure 14:
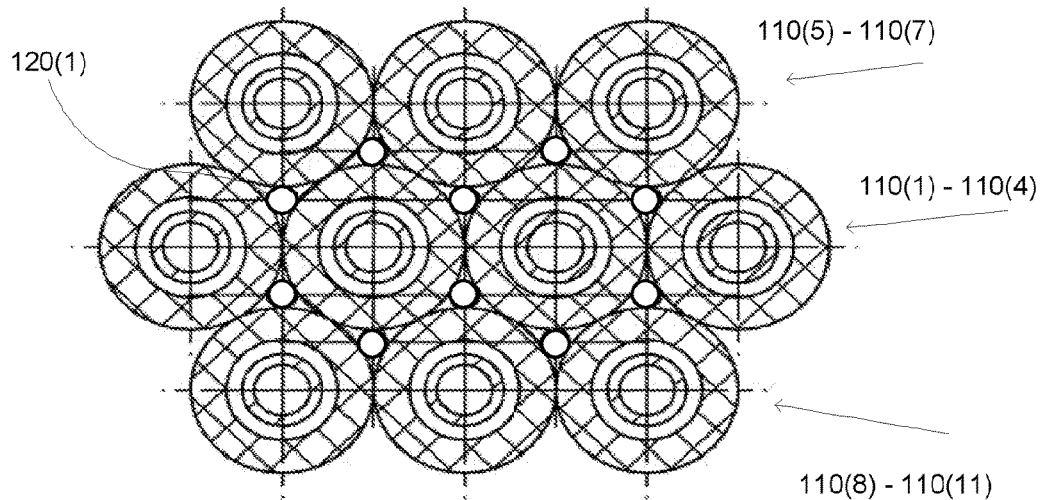

FIG. 12 illustrates—from right to left:
a. A mini-chamber 90 that includes an current source 93, a conductive housing 92 and a spiral tube 91 (instead of a capillary tube) located within the housing 92, wherein gas flows in an internal space defined by the housing 92 and the spiral tube 91 that is heated by current from current source 93.
b. A mini-chamber 102 and 101—each mini-chamber includes perforated foils (multiple heating elements 93) that are normal to the longitudinal axis of the mini-chamber and have on or more apertures 95 through which the gas may flow. The heating elements may be oriented in any non-normal angle to the longitudinal axis. The sidewalls 92 of the min-chambers may include ceramic bushings or other type of spacers between the multiple heating elements. The multiple heating elements may be electrically coupled (see, for example, external conductors 89) to each other and may form a sequence of heating elements that may be heated by current provided via electrical connections.

Non-limiting examples of dimensions—diameter of interior of a capillary tube may range between 0.05 mm and 10 mm; aspect ratio (inner diameter to length of capillary tube smaller than 1:5, distance between bottom of mini-chamber (hot filament unit) between 1 and 50 millimeter; and increasing of ratio of a heating surface in capillary tube to a gas volume to be radicalized versus conventional hot filament—being a number of orders of magnitude.

FIGS. 13-17 illustrate an array of multiple hot filament units. The array includes multiple first mini-chambers (denoted 120(1)1-120(10) in FIG. 14) for breaking H$_2$ and have a cylindrical shape. The array also includes multiple second mini-chambers (denoted 110(1)1-110(10) in FIG. 14) for breaking CH$_4$. The multiple second mini-chambers are positioned at gaps between the multiple first mini-chambers.

The mini-chambers may be controlled independently from each other.

For example, at least one of the following may be fulfilled:
a. The temperatures of the mini-chambers may be set independently from each other.
b. The flow of gas to the different mini-chambers may be independently controlled—by a distribution system. FIG. 5 illustrate flow control units such as flow distributors 61, 62 and 63 that are partially positioned within the mini-chambers and selectively limit the flow of gas through the mini-chambers. Additionally or alternatively, the flow distribution may be performed outside the mini-chambers. The flow distributors may move in relation to the internal spaces thereby controlling the flow.
c. The flow of radicals from different mini-chambers may be independently controlled—by a distribution system (not shown).

Using multiple hot filament units—and independently controlling the hot filament units provides a selective synthetic diamond printer.

Figure 15:
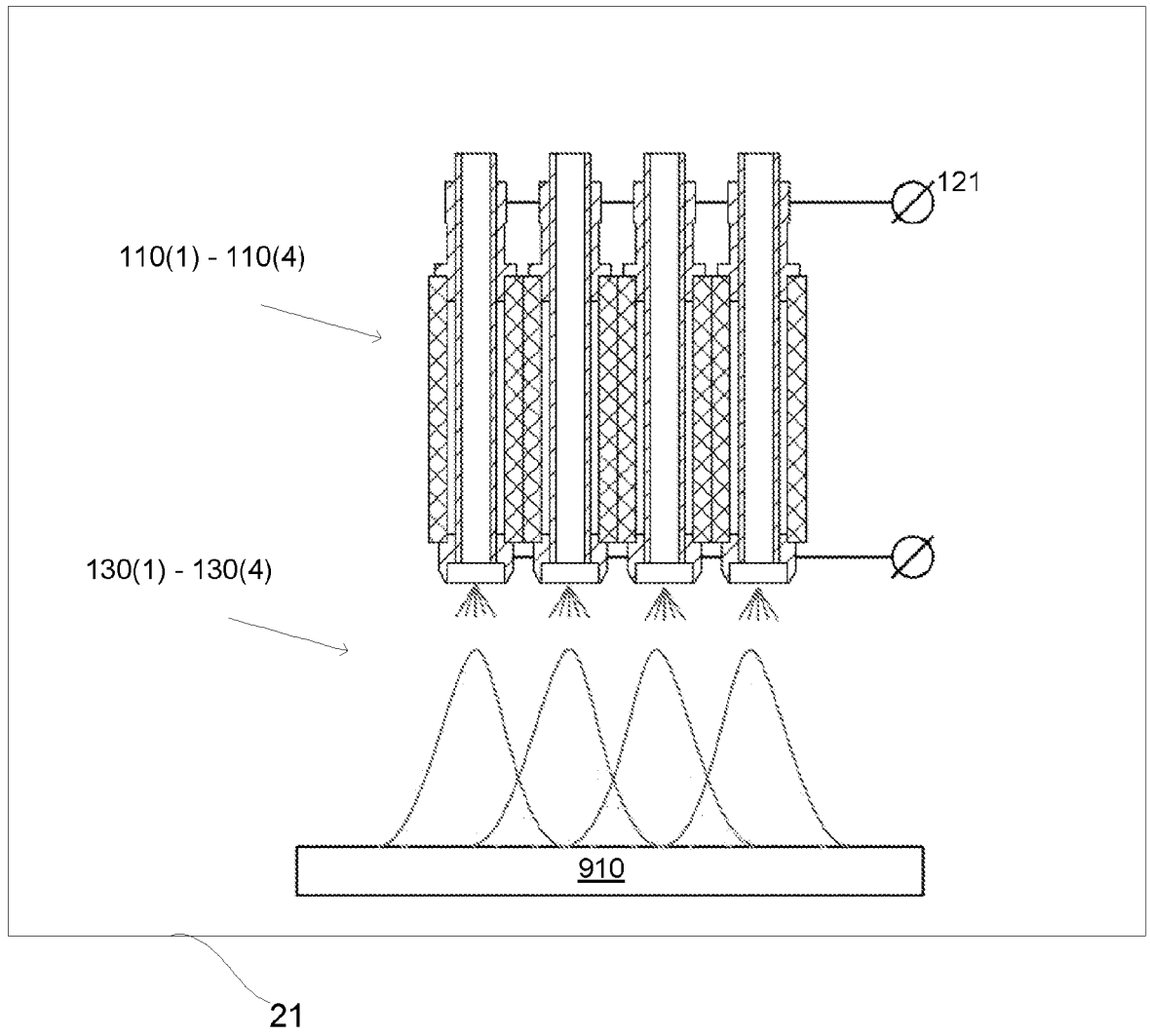
FIG. 15 is an example of a matrix of hot filament units and radical distribution.
Figure 16:
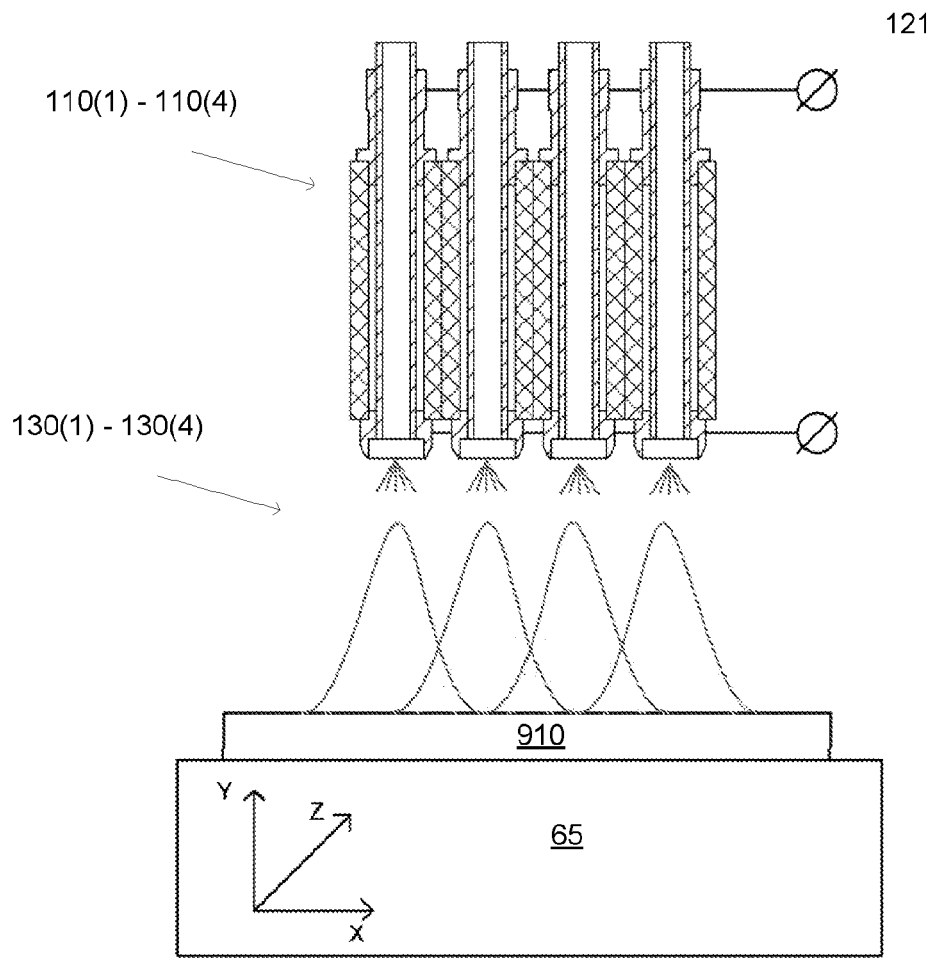
FIG. 16 is an example of a matrix of hot filament units with a substrate scanning device, and radical distribution.
Figure 17:
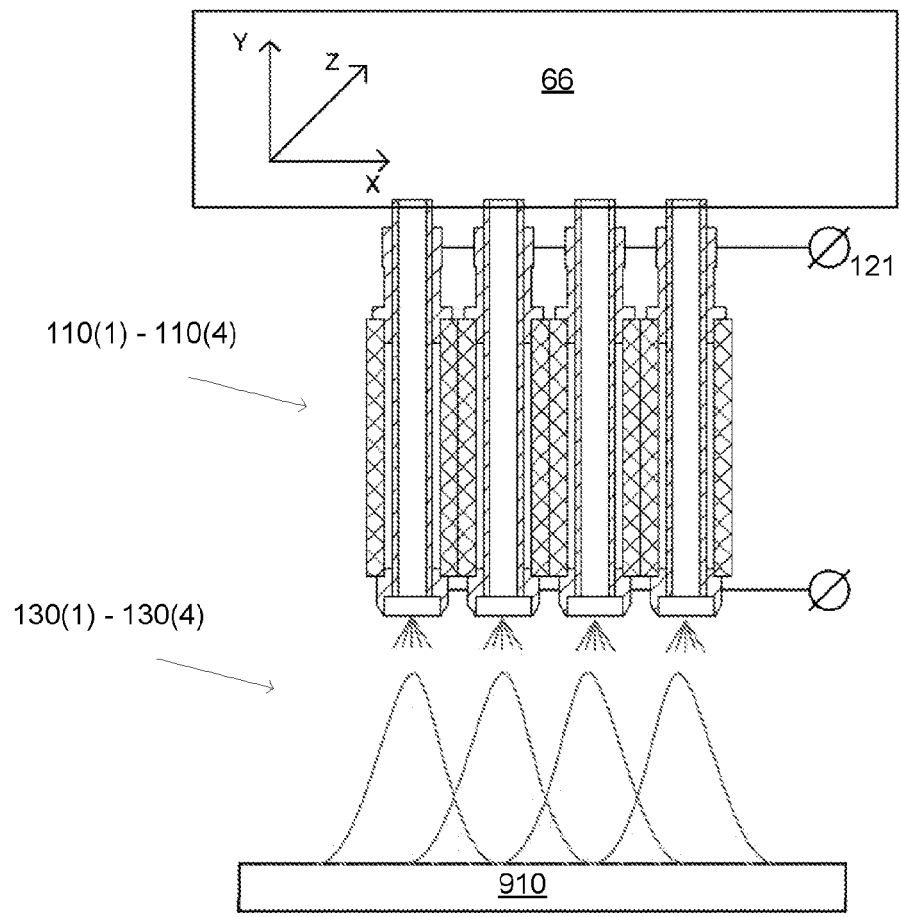
FIG. 17 is an example of a matrix of hot filament units with a substrate scanning device, and radical distribution.

FIG. 15-17 illustrate the radical distribution (partially overlapping radical distribution patterns 130(1)-130(4)) and a spacing between second mini-chambers 110(1)-110(4) that is about one half the width of the radical distribution. This allows the printer to fully cover any part of the substrate—especially when using a movement system to introduce movement between the substrate and the first and second mini-chambers.

The movement system (denoted 65 or 66) may move the substrate (FIGS. 6 and 16), move the hot filament unit(s)—(FIGS. 7 and 17)—or move both. FIG. 7 illustrates a fluid path 67 that is formed in movement system 66—for providing gas to the second mini-chamber 50.

The movement system may perform any movement—linear, non-linear, spiral, rotational, along any axes,—for example may perform a z-axis movement to determine the distance between the substrate and the hot filament unit(s).

The substrate may be heated to a desired temperature (for example 800 degrees) in order to facilitate the growth of the synthetic diamond.

According to an embodiment of the invention—instead of heating the entire substrate to the desired temperature—only selected parts of the substrate may be heated to the desired temperature—thus facilitating a selective synthetic diamond printing process.

The selective heating may be performed by at least one of the following:
a. Heating, by heating elements, only parts of the substrate to the desired temperature. The heating elements may be arranged in any manner. The heating elements may be included in the support unit and/or may be positioned above the support unit.
b. Heating the substrate to an intermediate temperature that is lower than the predefined temperature—and selectively heating selected parts of the substrate using other heating methods—such a radiation based heating. For example—using laser beams and/or charged particle beams may provide printing with nanometric scale and/or micron scale resolution. For example—the substrate may be heated to an intermediate temperature that is 10-250 degrees Celsius below the predefined temperature. For example—600 degrees Celsius versus 800 degrees Celsius.

Radiation based heating may involve passing the heating beam through a mini-chamber, between mini-chambers, through a hot filament unit, between hot filament units, outside hot-filament units, and the like. See, for example—FIGS. 8-11. The radiation may be light, infrared, near infrared, electrons, ions, or any other radiation.

The described systems may exhibit at least some of the following:
a. high efficiency of gas radicalization resulting in high grows rate of the synthetic diamond.
b. Higher level of vacuum environment resulting in longer free path of radicals.
c. Independence of hot filament temperature and substrate temperature.
d. Independent supply of H2 and CH4 or other Hydrocarbon gas eliminating HF material carbonization and resulting HF life prolongation.
e. Controllable distribution of different gases.
f. Selective printing.

There may be provided a method for manufacturing synthetic diamonds by using any of the mentioned above systems, mini-chambers, and/or hot filament units.

Figure 18:
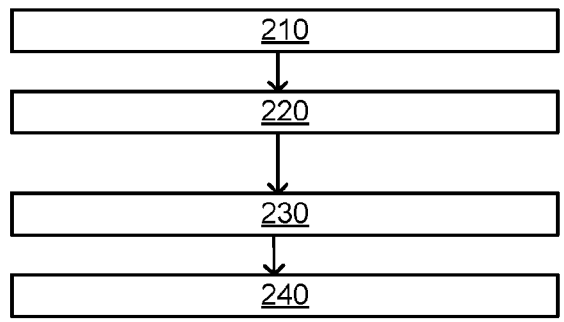
FIG. 18 includes an example of a method.

FIG. 18 illustrates method 200.

Method 200 may include:

Step 210 of heating at least one internal space of at least one hot filament unit; wherein the at least one hot filament unit is positioned in a vacuum chamber; wherein a volume of each internal space out of the at least one internal space is smaller than one half of a volume of the vacuum chamber.

Step 220 of feeding at least one gas to the at least one internal space; wherein the at least one gas comprises at least a carbon carrier gas.

Step 230 of breaking the at least one gas by the at least one hot filament unit, to provide at least one radical; and Step 240 of depositing the at least one radical on an area of a substrate to provide the diamond.

Step 240 may include directing (passively or actively) the radicals towards the substrate—especially towards the diamond that is being formed on the substrate.

The system and method may be applied to manufacturing objects that differs from synthetic diamonds.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements the mere fact that certain measures are recited in mutually different claims does not indicate that a combination of these measures cannot be used to advantage.

The terms having, comprising, consisting, consisting essentially of are used in an interchangeable manner. Any system illustrates above may include more that the described components or units and/or almost only the described components or units or only the described components or units.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for synthesizing a diamond by chemical vapor deposition, the method comprises:
    heating at least one internal space of multiple hot filament units; wherein the multiple hot filament units are positioned in a vacuum chamber; wherein a volume of each internal space out of the at least one internal space is smaller than one half of a volume of the vacuum chamber; wherein a hot filament unit of the multiple hot filament units is thermally isolated from at least one other hot filament unit of the multiple hot filament units;
    feeding a plurality of gases to the at least one internal space; wherein the plurality of gases comprise a carbon carrier gas;
    breaking the plurality of gases by the multiple hot filament units, to provide at least one radical; and
    depositing the at least one radical on an area of a substrate to provide the diamond.

2. The method according to claim 1, wherein the carbon carrier gas is methane and the plurality of gasess also comprise H2.

3. The method according to claim 1, wherein the breaking of the plurality of gases is executed while the plurality of gases are within the at least one internal space.

4. The method according to claim 1, wherein the at least one internal space is partially thermally isolated from the substrate.

5. The method according to claim 1, comprising feeding different gases of the plurality of gases to different hot filament units of the multiple hot filament units.

6. The method according to claim 1, comprising independently heating internal spaces of at least two hot filament units of the multiple hot filament units.

7. The method according to claim 1, comprising independently feeding gases of the plurality of gases to at least two hot filament units of the multiple hot filament units.

8. The method according to claim 1, wherein the multiple hot filament units comprise multiple capillary tubes.

9. The method according to claim 1, wherein the multiple hot filament units comprise multiple internal spaces; and wherein the method comprises controlling a flow of the plurality of gases within the at least one internal space using one or more flow controllers.

10. The method according to claim 9 wherein the one or more flow controller are configured to be at least partially positioned at a certain position in which the one or more flow controllers are within the one or more internal spaces.

11. The method according to claim 1, wherein the multiple hot filament units comprise multiple internal spaces.

12. The method according to claim 11 comprising independently heating at least two of the multiple internal spaces.

13. The method according to claim 11 comprising heating the multiple internal spaces by a group of heating elements.

14. The method according to claim 13 wherein there are more internal spaces than heating elements of the group.

15. The method according to claim 1, comprising heating at least one area of the substrate.

16. The method according to claim 1, comprising selectively heating some points of the substrate while preventing from directly heating other points of the substrate.

17. The method according to claim 1, comprising heating by radiation some points of the substrate.

18. The method according to claim 1 wherein the heating of at least one internal space of at least one hot filament unit comprises utilizing an external heating element located outside at least one internal space.

19. The method according to claim 1 a ratio between (a) the volume of the vacuum chamber and (b) a volume of one of the at least one internal space ranges between five and one hundred.

20. A method for synthesizing a diamond by chemical vapor deposition, the method comprises:
    heating internal spaces of multiple hot filament units; wherein the multiple hot filament units are positioned in a vacuum chamber; wherein a volume of each internal space out of the internal spaces is smaller than one half of a volume of the vacuum chamber;
    feeding a plurality of gases to the internal spaces; wherein the plurality of gases comprise a carbon carrier gas;
    breaking the plurality of gases by the multiple hot filament units, to provide at least one radical; and
    depositing the at least one radical on an area of a substrate to provide the diamond; wherein a hot filament unit of the multiple hot filament units and another hot filament unit of the multiple hot filament units are coaxial.

* * * * *